United States Patent [19]

Gilchrist et al.

[11] 4,205,280

[45] May 27, 1980

[54] SURFACE WAVE DEVICE WITH SUPPRESSED BOUNDARY-REFLECTED WAVES

[75] Inventors: Forbes D. Gilchrist, Des Plaines; Robert L. Miller, Schaumburg; Richard W. Myers, Northbrook, all of Ill.

[73] Assignee: Zenith Radio Corporation, Glenview, Ill.

[21] Appl. No.: 939,575

[22] Filed: Sep. 5, 1978

Related U.S. Application Data

[63] Continuation-in-part of Ser. No. 934,915, Aug. 18, 1978, abandoned.

[51] Int. Cl.² .................. H03H 9/04; H03H 9/26; H03H 9/30; H03H 9/32
[52] U.S. Cl. .................................... 333/151; 310/313; 333/194; 333/196
[58] Field of Search ......... 333/72, 30 R, 71, 150–155, 333/193–196; 310/313; 331/107 A; 330/5.5; 29/25.35

[56] References Cited

U.S. PATENT DOCUMENTS

3,699,364  10/1972  Gerard ........................... 333/194 X

FOREIGN PATENT DOCUMENTS

2237340  2/1974  Fed. Rep. of Germany ............ 333/72
2346204  3/1975  Fed. Rep. of Germany ........... 310/313

Primary Examiner—Alfred E. Smith
Assistant Examiner—Marvin Nussbaum
Attorney, Agent, or Firm—John H. Coult

[57] ABSTRACT

This disclosure depicts a surface wave transmitting device having a piezoelectric surface wave propagative medium and interdigitated comb-type input and output transducers on a surface of said medium. The input transducer is responsive to a source of input signals for launching on the surface of the medium surface waves of predetermined center wavelength. The output transducer receives the surface waves from the input transducer and develops output signals. The device is improved by one of the input and output transducers having at a transducer boundary or at an internal irregularity in the transducer tooth pattern a first tooth on a first comb connected to its associated bus bar. On an opposed second comb, there is provided a second tooth collinear with the first tooth but electrically isolated from its associated bus bar. Spurious surface waves reflected from the first and second teeth of the one transducer are in canceling phase relationship due to the fact that the first tooth is electrically connected to the associated comb bus bar while said second tooth is not. The other of the input and output transducers is of sufficient width on the surface of the medium to intercept and electrically destructively combine the out-of-phase spurious waves reflected from the first and second teeth.

13 Claims, 2 Drawing Figures

SURFACE WAVE DEVICE WITH SUPPRESSED BOUNDARY-REFLECTED WAVES

CROSS-REFERENCE TO RELATED APPLICATION

This application is a continuation-in-part of our application Ser. No. 934,915, filed Aug. 18, 1978, now abandoned, of common ownership herewith.

BACKGROUND OF THE INVENTION

This invention pertains in general to surface wave devices. These are a class of well-known devices comprising a medium capable of propagating surface waves, an input or launching transducer for launching surface waves across a surface of the substrate, and an output or receiving transducer for receiving the propagated surface waves. Such devices have been developed to an advanced state and are now in commercial use.

This invention pertains particularly to novel surface wave devices having the property that the mechanical component of spurious waves reflected from a transducer boundary or internal irregularity are suppressed.

It has been known that an electrode array composed of a pair of interdigitated combs of conductive teeth at unlike potentials, if coupled to a piezoelectric medium, produces acoustic surface waves on the medium. In a simplified embodiment of a piezoelectric ceramic poled perpendicularly to the propagating surface, the waves travel at right angles to the teeth. The surface waves are converted back into electrical signals by a similar array of conductive teeth coupled to the piezoelectric medium and spaced from the input electrode array. In principle, the tooth pattern is analogous to an antenna array. Consequently, similar signal selectivity is possible, thereby eliminating the need for the critical or much larger and more cumbersome components normally associated with frequency-selective circuitry. Thus, such a device, with its small size, is particularly useful in conjunction with solid-state functional integrated circuitry where signal selectivity is desired.

The usual surface wave device has a finite distance between its input and output transducers. Hence, a finite time is required for an acoustic surface wave to travel along the path from the input transducer to the output transducer. At the output transducer, part of the acoustic-wave energy is converted to electrical energy and delivered to a load. Another part of the acoustic-wave energy is transmitted past the output transducer where it may be terminated or dissipated. A still further part of the arriving acoustic-wave energy is reflected back along the original path toward the input transducer. This reflected surface wave, which is smaller in magnitude than the original surface wave, intercepts the input transducer from which a portion of the wave again is similarly reflected back along the same path to the output transducer where it appears as a diminished replica of the original surface wave. Because of the additional distance of travel, the smaller version of the original surface wave arrives at the output transducer later than that original wave. The time delay is equal to twice the time required for a surface wave to transverse the path from the input transducer to the output transducer. When such a surface wave device is used, for example, as a signal-selective device in a television intermediate-frequency amplifier, the triple-transit reflected signal components appear as a ghost in the picture and makes it highly undesirable, if not completely unacceptable, for normal viewing.

The non-aimed end of a surface wave transducer is another source of spurious reflections. Intelligence-bearing surface waves launched by a transducer in the opposite direction from the receiving transducer reflect internally from the non-aimed end, propagate internally across the transducer, and emerge from the aimed end out of phase with the main waves. The internally reflected spurious boundary wave will appear as a ghost when received by the output transducer.

Still another source of spurious reflections are irregularities within the transducer tooth pattern in the form of radical changes in the width or spacing of the comb teeth.

Known methods for approaching the spurious wave problem have included optimizing the signal-transducing characteristics of one or both of the input and output transducers, depositing an attenuating material between the input and output transducers, and utilizing an additional transducer, spaced from the input and output transducers, responsive to a portion of the original surface wave for generating a still additional acoustic surface wave that at least partially counteracts the undesired acoustic wave orginally reflected back from the output transducer.

An improvement in the latter respect is disclosed and claimed in a patent to Adrian DeVries, U.S. Pat. No. 3,727,155, assigned to the same assignee as the present application. As there taught, reflection components, arising by reason of mechanical loading of the substrate by a transducer, and local electric field shorting caused by the transducer electrodes, are at least reduced by subdividing each "tooth" of the interdigitated combs into a pair of conductively connected ribbons spaced apart by one-fourth the acoustic wavelength. For best results, the DeVries transducer is connected to a source or load impedance significantly smaller than the impedance of the transducer itself. It is recognized in U.S. Pat. No. 3,723,419 by Robert Adler and assigned to the same assignee as the present invention, that at least under certain load conditions an additional contributor to the production of reflection components in a transducer of the DeVries type may be electrical loading of the substrate which occurs as a result of electrical shorts created by conductive bars that interconnect different ones of the ribbons. The approach described and claimed in the Adler application seeks to overcome such additional electrical loading by individually connecting the respective ribbons of each adjacent "tooth"-forming pair to correspondingly separate electrical loads. However, the necessity of associating the surface wave device with such plural loads and the attendant isolation schemes result in substantial complexity.

Yet another approach to eliminating triple-transit reflections is taught in U.S. Pat. No. 3,662,293-DeVries, assigned to the assignee of the present application. It is there taught that in order to inhibit the development of spurious reflections, a plurality of surface discontinuities such as grooves are formed in the wave propagating surface alongside the output transducer. These grooves reflect surface waves and are spaced from the input transducer by such a distance that surface waves reflected from the grooves reach the input transducer in a predetermined time and phase relationship with respect to acoustic surface waves reflected by the output transducer. At least partial cancellation of the spurious reflections results.

Still another approach is taught in U.S. Pat. No. 3,748,603 Wojcik, also assigned to the assignee of the present application. Wojcik discloses a surface wave device having input and output transducers disposed on a surface of a wave-propagative medium. One or both of the transducers includes a pair of interdigitated combs of conductive material disposed along the propagation path. Adjacent teeth of the combs are spaced apart by a center-to-center distance of one-half the acoustic center wavelength. Electrically isolated conductive ribbons are disposed individually between the teeth in respective different pairs of adjacent teeth. The center-to-center spacing between each of the ribbons and the ones of the teeth adjacent thereto is one-fourth the acoustic center wavelength. The Wojcik teaching results in at least partial cancellation of waves reflected internally from the regular pattern of teeth which constitutes the body of the transducer.

It is known that in a surface wave resonator, surface waves reflected from a periodic array of electrically isolated conductive teeth or ribbons will be 180° out of phase with waves reflected from a periodic array of ribbons or teeth which are bussed together. See "Relations for Analysis and Design of Surface Wave Resonators" Matthaei et al, *IEEE Transactions on Sonics*, Vol. SU-L3, No. 2, March, 1976. See also "Reflective Arrays for SAW Resonators", P. S. Cross, 1975 *Ultrasonics Symposium Proceedings*, IEEE Cat. No. 75 CHO 994-4SU, "Properties of Reflective Arrays for Surface Acoustic Resonators", P. S. Cross, *IEEE Transactions on Sonics*, Vol. SU-23, No. 4, July, 1976, and "Reflections on Surface Waves from Periodic Discontinuities", C. Dunnrowicz et al, 1976 *Ultrasonics Symposium Proceedings*, IEEE Cat. No. 76 CHII20-5SU.

It is very significant that all of the approaches to reflected wave cancellation which rely on quarter wave spacing of reflecting boundaries, e.g., U.S. Pat. No. 3,662,293-DeVries or U.S. Pat. No. 3,748,603-Wojcik, effect theoretically perfect cancellation at the synchronous (center) frequency only.

Other U.S. patents which pertain to surface wave devices and in particular to cancellation of spurious reflections in surface wave devices are: U.S. Pat. No. 3,757,256-Whitehouse et al; U.S. Pat. No. 3,573,673-DeVries et al; U.S. Pat. No. 3,582,838-DeVries; U.S. Pat. No. 3,596,211-Dias et al; U.S. Pat. No. 3,559,115-DeVries; and U.S. Pat. No. 3,582,540-Adler et al.

OBJECTS OF THE INVENTION

It is a general object of the present invention to provide a new improved surface wave device in which the mechanical components of spurious surface waves which are reflected from a surface wave transducer boundary, or an internal irregularity within a transducer, are suppressed.

It is another important object of this invention to provide a surface wave device in which such suppression is not limited to the center frequency only, but is produced in a broad band of frequencies in the reflected wave.

It is yet another object of the present invention to provide such a surface wave device in which the reflection suppression feature adds no cost to the device.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings in which:

DESCRIPTION OF THE PREFERRED EMBODIMENTS

Figure 1:
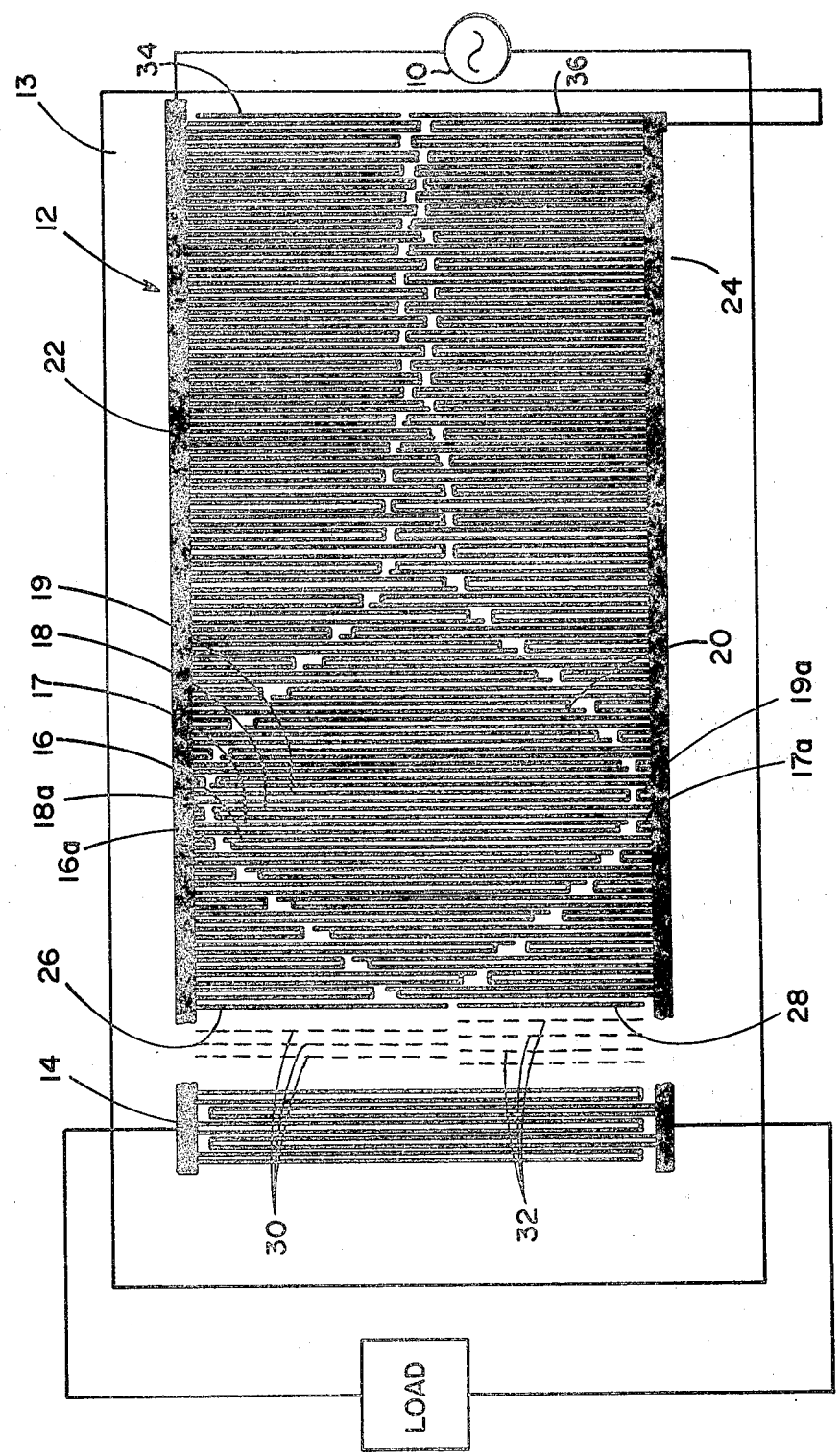
FIG. 1 is a partly schematic plan view of a surface wave device embodying the teachings of the present invention.

In FIG. 1, an input signal source 10 is connected across an electrode array which is mechanically coupled to a piezoelectric acoustic-wave-propagating medium or substrate 13 to constitute therewith an input transducer 12. An output electrode array is also mechanically coupled to substrate 13 to constitute therewith an output transducer 14. Transducers 12 and 14 are each constructed of two interleaved or interdigitated comb-type electrodes of a conductive material, such as gold or aluminum, which may be vacuum deposited on a smoothly-lapped and polished planar upper surface of the substrate 13. The piezoelectric material is one such as PZT or lithium niobate which propagates acoustic surface waves.

In operation, direct piezoelectric surface-wave-transduction is accomplished by input transducer 12. Periodic electric fields are produced across the comb array when a signal from source 10 is applied to the electrodes. These fields cause perturbations or deformations of the surface of substrate 13 by piezoelectric action. Efficient generation of surface waves occurs when the strain components produced by the electric fields in the piezoelectric substrate substantially match the strain components associated with the surface-wave mode. These mechanical perturbations travel along the surface of substrate 13 as generalized surface waves representative of the input signal.

Source 10 might, for example, be the radio-frequency portion of a television receiver tuner that produces a range of signal frequencies. However, due to the selective nature of transducers 12 and 14, only a particular frequency and its intelligence-carrying sidebands are converted to surface waves. Those surface waves are transmitted along the substrate to output transducer 14 where they ae converted to an electrical signal for transmission to a load 15 connected across the two interdigitated combs in output transducer 14. In this example, load 15 represents a subsequent radio-frequency input stage of the tuner such as the heterodyne converter which downshifts the signal frequency to an intermediate frequency.

The potential developed between any given pair of successive teeth in electrode array 12 produces two waves traveling along the surface of substrate 13 in opposing directions, perpendicular to the teeth for the illustrative case of a piezoelectric ceramic substrate which is poled perpendicularly to the surface. When the center-to-center distance between the teeth is one-half of the acoustic wavelength of the wave at the desired input signal frequency, the so-called center of synchronous frequency, relative maxima of the output waves are produced by piezoelectric transduction in transducer 12.

To improve the frequency response of transducer 12, it is preferably of the "apodized" type as shown, wherein the combs of the transducer have a predetermined gradation in the length of overlap between the interactive comb teeth. Apodized surface wave transducers are well-known in the art. Specifically, examples of active teeth in the transducer 12 are those shown at 16, 17, 18 and 19. An active tooth is a tooth having a section overlapping a tooth connected to the bus bar of an opposed comb. The interactive regions of these active teeth can be seen in FIG. 12 to define a "manta" configuration symmetric with the transducer axis.

In order to present a uniform acoustical impedance and propagation velocity to surface waves propagating through the transducer 12 (and thus to prevent perturbations in the wavefronts), on the opposite side of the transducer from each of the active teeth, and collinear therewith, is an inactive tooth. The inactive teeth associated with each of the active teeth 16, 17, 18 and 19 are designated 16a, 17a, 18a and 19a, respectively. Since a metalized surface area induces a lower acoustical velocity to surface waves than a non-metalized surface area, the area filling with inactive teeth evens out the acoustical velocity throughout the transducer.

To prevent internal tooth-from-tooth reflections within the transducer, the transducer 12 is shown as being of the split tooth type as taught by DeVries in the above discussed U.S. Pat. No. 3,727,155. Each of the teeth 16, 17, 18 and 19, for example, is separated, nominally, by a fuel-wavelength at the center frequency. This causes the wave contributions from each interactive tooth edge to be in phase. However, to prevent internal reflections from the teeth which make up the transducer pattern, each of the teeth is split into nominally one-eighth center wavelength ribbons separated by nominally one-eighth center wavelength spacing. This means that successive ribbons have their leading edges spaced by one quarter center wavelength (nominal), resulting in cancellation at the center frequency of internally reflected spurious mechanical wave components.

The ribbons constituting each tooth in the body of the transducer are interconnected by a shorting bar, one of which is shown at 20 in the figure. The shorting bars are provided to insure that should a discontinuity in one of the ribbons which constitute a tooth be open circuited during fabrication of the transducer, the entire tooth would nevertheless be excited from one of the comb bus bars 22, 24.

Surface wave devices generate a variety of spurious reflected waves. Some are electrical in nature and others are mechanical. We are here concerned with the mechanical components of reflected surface waves.

Spurious mechanical wave components derive from a number of sources. As explained above, mechanical wave reflections occur whenever a traveling surface wave meets a boundary of a surface presenting a different acoustical impedance to the wave. It can be seen that such boundaries occur at the leading and trailing edges of each tooth or ribbon and at the entry into and exit from the transducer body. By using techniques such as taught in DeVries U.S. Pat. No. 3,737,155, reflections from the teeth which constitute the body of a transducer are suppressed. However, reflections of the waves at the boundaries of the transducer, either upon entering into or exiting therefrom, create boundary-reflected spurious waves which are not compensated by the DeVries teaching.

As noted, spurious reflections are also caused by irregularities within the transducer tooth pattern. These may take the form of radical changes in the width or spacing of the comb teeth. Apodized transducers are commonly of computer generated design and may have tooth width and spacing variations. Typically these variations, if any, are gradual and cause no reflection problems. However, if the changes are radical, the resulting reflections may be of such magnitude as to be objectionable.

The FIG. 1 embodiment below is addressed to the suppression of spurious boundary reflections; the FIG. 2 embodiment shows, in addition, that the present invention also suppresses reflections from tooth spacing irregularities within a transducer tooth pattern.

The invention is particularly advantageously applied to transducers of the apodized type or other types wherein the terminal teeth are not widely disparate in length, for example, not greater than an order of magnitude different in length. The reason for this limitation will become evident hereinafter.

As shown in the figure, transducer 12 is terminated at its end nearest the output transducer 14 by an active terminal tooth 26 and an inactive terminal tooth 28. In the illustrated preferred embodiment, the active and inactive teeth 26, 28 comprise one ribbon of a split tooth DeVries-type transducer element. A single ribbon is used in each of the terminal teeth 26, 28 to prevent the interactive field strength at the transducer boundary from becoming disproportionately large. As with the other ribbons constituting the teeth in the transducer 12, the terminal teeth 26, 28 are each nominally one-eighth center wavelength wide and are spaced nominally one-eighth wavelength from their neighboring transducer teeth. Without more, the transducer 12 would have the undesirable property of reflecting waves entering the transducer or leaving it, producing spurious triple-transit and other reflection components when received at the output transducer 14.

In accordance with this invention, by a very small change in the design of the metalized transducer pattern, and at absolutely no cost to the manufacturer of the device, a significant improvement in the transient response of the device results. This modification or change is no less than to merely electrically break from its bus bar the inactive terminal tooth 28 such that it is electrically isolated or "floating". This modification produces a very dramatic change in the nature of the boundary-reflected surface waves.

This invention takes advantage of the property of surface-reflected waves that waves reflected from a tooth or ribbon which is joined to a bus bar are 180° out of phase with boundary-reflected waves from an electrically isolated tooth. Referring to the figure, it will be understood then that traveling surface waves exiting or entering the transducer 12 will produce boundary-reflected waves from the active terminal tooth 26 which are 180° out of phase with the boundary-reflected waves off inactive terminal tooth 28.

Although such is not believed to be a critical limitation, in the illustrated preferred embodiment, for reasons to be explained, the active terminal tooth 26 and the inactive terminal tooth 28 are arranged to be collinear.

Before proceeding further, it should be explained that the property of surface waves of reflecting at 180°-displaced phase relationship off a bussed tooth and an electrically isolated tooth is a property which takes place at substantially all surface wave frequencies. In other words, unlike all spurious wave cancelling mechanisms which employ quarter wave-length or other spacings to achieve cancellation or reflected waves, this property is substantially wavelength independent.

Turning again to the figure, there is shown in broken lines at 30 a simulation of waves boundary-reflected from active terminal tooth 26. Similarly, broken lines 32 depict surface waves boundary-reflected off inactive terminal tooth 28. As explained and as shown in the figure, the spurious reflected waves 30 and 32 are 180° out of phase. By arranging the terminal teeth 26, 28 along the transducer axis such that spurious boundary-reflected waves from one of the teeth 26, 28 are in cancelling phase relationship with waves reflected from the other tooth, and with the provision that the output transducer 14 is of sufficient width on the medium surface to intercept and electrically destructively combine the out-of-phase spurious waves, the output transducer 14 will develop output signals in which spurious signal components due to the aforesaid mechanical boundary-reflected waves are suppressed.

Because the energy in the reflected waves 30, 32 is, all other things being equal, in direct proportion to the length of the teeth 26, 28, it follows that the spurious wave suppression which is achieved in the output signals developed from the output transducer 14 is in inverse relation to the magnitude of the difference in the lengths of the terminal teeth 26, 28. In the ideal case for perfect cancellation, the lengths of the active and inactive terminal teeth 26, 28 would be nearly equal, with adjustment for differences in coefficients of reflection from teeth 26 and 28. This implies a zero or node in the apodization pattern of the transducer teeth at the transducer boundary.

In the illustrated FIG. 1 embodiment, it is seen that the active and inactive terminal tooth lengths are generally the same, but are not exactly equal. As mentioned, for significant reflected wave cancellation to occur, the active and inactive teeth should not differ in length by more than an order of magnitude. Any difference greater than that will result in relatively insignificant spurious wave cancellation.

Thus it can be seen that by the simple expedient, according to this invention, of floating the inactive terminal teeth, very substantial suppression of boundary-reflected waves can be achieved in a broad band of wavelengths centered on the center wavelength for which the surface wave device is designed.

As shown in the figure, the invention is preferably applied at both ends of transducer 12. At the opposed non-aimed end of the transducer the inactive tooth 34 is electrically isolated from its associated bus bar. The active tooth 36 on the other side of the transducer is electrically connected to its bus bar. Thus surface waves boundary-reflected internally back through the transducer toward the output transducer 14 will have components reflected from the inactive tooth 34 which are 180° out of phase from wave components reflected from the active tooth 36. Upon reaching the output transducer 14 the reflected wave energy is cancelled in inverse relation to the magnitude of the difference in the lengths of the terminal teeth 34, 36.

For the reasons given above, the output transducer may be of standard construction; it should be of sufficient width to intercept boundary-reflected spurious wave components from both the active and inactive terminal teeth.

The FIG. 1 embodiment illustrates the present invention as applied to suppress spurious wave reflections off boundaries of a surface wave transducer (external or on internal openings). The invention has broader application. The present invention may be applied to transducer of the type having first and second combs defining a pattern of interdigitated teeth and having at a transducer internal tooth spacing irregularity a first tooth on the first comb connected to its associated bus bar and on the opposed second comb a second tooth electrically isolated from its associated bus bar. As described above, the internal tooth spacing irregularity may be in the form of a radical departure in width of a tooth (either broader or narrower), or a radical departure in tooth spacing, of such abruptness as to cause objectionable spurious wave reflections.

Figure 2:
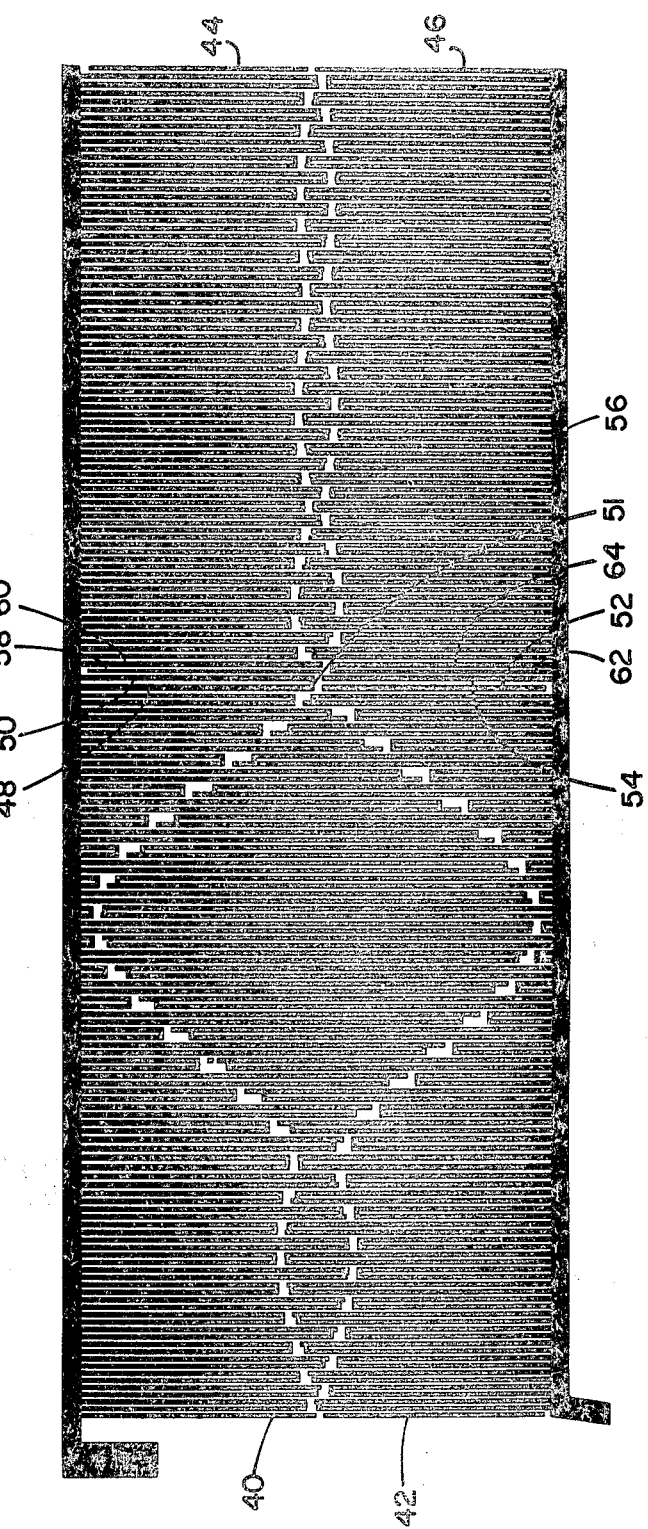
FIG. 2 is a transducer pattern which may be used in the FIG. 1 device and represents an alternative embodiment of the invention.

FIG. 2 depicts a surface wave transducer metalization pattern 38 representing a second embodiment of the invention. The FIG. 2 pattern may be substituted for the pattern of transducer 12 in the FIG. 1 embodiment. The FIG. 2 transducer pattern is also of the apodized type, the pattern being shown in full rather than in the somewhat abbreviated form of the FIG. 1 transducer 12.

The FIG. 2 embodiment shows the invention applied at terminal teeth 40, 42 at one end of the transducer and terminal teeth 44, 46 at the opposed end. In this connection, the above description with respect to the FIG. 1 embodiment is applicable to the FIG. 2 transducer pattern.

The FIG. 2 embodiment is depicted in order to show application of the invention to suppress spurious waves reflected from spacing irregularities in the tooth pattern within the body of a transducer.

In the FIG. 2 embodiment there is disclosed a tooth made up of tooth elements 48, 50 connected by a shorting bar 51. The tooth element 48 is characterized by its having a radical departure in tooth element width and in overall tooth width from the nominal tooth element width and tooth width of the majority of teeth in the transducer pattern. Such a radical departure, which may, for example, be outside the range of from $\frac{2}{3}$ to $1\frac{1}{3}$ times the nominal tooth or tooth element width, will cause internal reflections within the transducer body (both directions). Opposite the tooth elements 48, 50 which comprise the aforesaid wide tooth, and collinear therewith is disposed a second tooth similarly constructed, comprising tooth elements 52, 54. In order to suppress reflections off these collinearly arranged tooth elements 48, 52, in accordance with this invention, the tooth element 52 is isolated from its associated bus bar 56. The manner in which spurious wave cancellation upon reflection off the tooth elements 48 and 52 occurs is as described above with respect to the terminal teeth 26, 28 and 34, 36.

Opposite the tooth constituted by elements 58 and 60 is a similarly constituted tooth comprising elements 62 and 64. Tooth element 62 is narrower than nominal and is of the same width as tooth 58.

In order to compensate for spurious waves reflecting internally off the narrower-than-nominal tooth elements 60, 62, in accordance with the teachings of this invention the tooth element 60 is electrically isolated from its associated bus bar 66. Thus in accordance with the invention, spurious surface waves reflected from the tooth elements 48, 52 and from the tooth elements 60, 62 will be in canceling phase relationship due to the face that in each of the pairs, one tooth element is electrically connected to its associated comb bus bar while the other in the pair is not.

The FIG. 2 embodiment also shows that the invention is not limited in its application to tooth pairs one of which is active and the other inactive. In the FIG. 2 embodiment the teeth constituted by tooth elements 48, 50 and 52, 54 are positioned at a node in the apodization pattern. Thus neither of the teeth can be considered to be active. It is important to understand that the present invention, for its effective performance, requires only that one of the associated pairs of teeth (or tooth elements) be electrically isolated from its associated bus bar while the other is electrically connected to its bus bar.

In applications to apodized transducers where the boundary or irregularity does not occur at a node, it is preferred to isolate the inactive, rather than the active, tooth or tooth element only so as not to lose the programmed signal generation capacity of the active tooth.

The FIG. 2 application of the invention to an internal irregularity in a transducer pattern located at a node in an apodization pattern represents an ideal application of the invention in terms of obtaining perfect cancellation. As explained above with respect to FIG. 1, suppression occurs in inverse relation to the magnitude of the difference in length of the connected and disconnected teeth or tooth elements. Where the difference is substantially zero, perfect cancellation may occur, all other considerations aside.

Whereas in the FIGS. 1 and 2 embodiments the apodized transducer with spurious wave suppression according to the invention have been described as being the input transducer. It should be understood that the said transducer may be as well be the output transducer. If such is the case, waves launched by the input transducer (which may be as shown at 14 in FIG. 1) will not be reflected off boundaries or irregularities in the output transducer since it is adapted with the present invention. Triple transit reflections are thus suppressed.

The invention may also be applied to surface wave devices of other types and constructions. For example, the invention is applicable in surface wave systems including a surface wave multi-strip coupler element which picks up and integrates out the reflected wave components. A multistrip coupler does not develop output signals, but rather acts to transfer surface acoustic waves from one transducer to another.

While particular embodiments of the invention have been shown and described, it will be obvious to one skilled in the art that changes and modifications may be made without departing from the invention in its broader aspects, and, therefore, the aim in the appended claims is to cover all such changes and modifications as fall within the true spirit and scope of the invention.

We claim:

1. In a surface wave transmitting device having a piezoelectric surface wave propagative medium and an interdigitated comb surface wave transducer on a surface of said medium for launching or receiving on said surface of said medium surface wave of predetermined wavelength, the improvement characterized by said transducer having at a transducer boundary or at an internal spacing irregularity in the transducer tooth pattern a first tooth on a first comb connected to its associated bus bar, and, on an opposed second comb a second tooth collinear with said first tooth but electrically isolated from its associated bus bar.

2. The device defined by claim 1 wherein said transducer is of the apodized type, wherein said first and second teeth are of approximately the same length and are terminal teeth at one end of said transducer.

3. In a surface wave transmitting device having a piezoelectric surface wave propagative medium and an interdigitated comb surface wave transducer on a surface of said medium for launching or receiving on said surface of said medium surface waves of predetermined center wavelength, said transducer having an internal spacing irregularity in the transducer tooth pattern in the form of collinear first and second internal teeth on opposed first and second combs whose widths and alike but so different from the width of the teeth in the main body of the transducer tooth pattern as to cause objectionable spurious reflected waves, the improvement characterized by said first tooth being connected to its associated bus bar, and said second tooth being electrically isolated from its associated bus bar.

4. In a surface wave transmitting device having a piezoelectric surface wave propagative medium and interdigitated comb-type input and output transducers on a surface of said medium, said input transducer being responsive to a source of input signals for launching on said surface of said medium surface waves of predetermined center wavelength, said output transducer receiving said surface waves from said input transducer to develop output signals, the improvement characterized by:

one of said input and output transducers having at a transducer boundary or at an internal spacing irregularity in the transducer tooth pattern a first tooth on a first comb connected to its associated bus bar and, on an opposed second comb, a second tooth collinear with said first tooth but electrically isolated from its associated bus bar, whereby spurious surface waves reflected from said first and second teeth of said one transducer are in canceling phase relationship due to the fact that said first tooth is electrically connected to the associated comb bus bar while said second tooth is not, and the other of said input and output transducers being of sufficient width on said surface of said medium to intercept and electrically destructively combine said out-of-phase spurious waves reflected from said first and second teeth.

5. The device defined by claim 4 wherein said one transducer is of the apodized type, wherein said first and second teeth are of approximately the same length and are terminal teeth at one end of said transducer, said first tooth being an active tooth and said second tooth being an inactive tooth.

6. In a surface wave transmitting device having a piezoelectric surface wave propagative medium and an interdigitated comb-type transducer on a surface of said medium responsive to input signals for launching or receiving on said surface of said medium surface waves of predetermined center wavelength, said transducer having interdigitated first and second combs, the improvement characterized by:

said transducer having a first terminal tooth on said first comb electrically disconnected from the bus bar of said comb and having on an opposed second comb a second terminal tooth electrically connected to the bus bar of said second comb, whereby surface waves entering or exiting said transducer at said one end produce boundary-reflected waves from said first and second terminal teeth are 180° out of phase due to the fact that said second terminal tooth is electrically connected to the associated comb bus bar while said first terminal tooth is not, and wherein said transducer is further characterized by having the axial positions of said terminal teeth along the transducer axis correlated such that spurious waves boundary-reflected from one terminal tooth are in canceling phase relationship with waves reflected from the other terminal tooth.

7. In a surface wave transmitting device having a piezoelectric surface wave propagative medium and an interdigitated comb-type transducer on a surface of said medium responsive to input signals for launching or receiving on said surface of said medium waves of predetermined center wavelength, said transducer being terminated, on at least one end, by teeth on opposed first and second combs whose lengths differ by much less than an order of magnitude, the improvement characterized by:

said transducer having the terminal tooth on said first comb electrically disconnected from the bus bar of said first comb and having the opposed terminal tooth on said second comb electrically connected to the bus bar of said second comb, whereby surface waves entering or exiting said transducer at said one end produce boundary-reflected waves from said terminal teeth which are 180° out of phase due to the fact that said one terminal tooth is electrically connected to the associated comb bus bar while the other tooth is not, and wherein said transducer is further characterized by having said terminal teeth collinear such that spurious waves boundary-reflected from one terminal tooth are in canceling phase relationship with waves reflected from the other terminal tooth in a wide band of wavelengths centered on said center wavelength.

8. In a surface wave transmitting device having a piezoelectric surface wave propagative medium and an apodized interdigitated comb-type transducer on a surface of said medium responsive to input signals for launching on said surface of said medium surface waves of predetermined center wavelength, said transducer comprising interdigitated interactive combs of conductive teeth, the combs of said transducer having a predetermined gradation in the length of overlap between the active comb teeth, that is, the adjacent overlapped teeth connected to the bus bars of opposed combs, said combs each having an inactive tooth collinear with each active tooth on the opposed comb, said transducer being terminated, on at least one end, by teeth on opposed first and second combs of approximately the same length, the improvement characterized by:

said transducer having the terminal tooth on said first comb inactive and electrically disconnected from the bus bar of said first comb and having the opposed terminal tooth on said second comb active and electrically connected to the bus bar of said second comb, whereby surface waves entering or exiting said transducer at said one end produce boundary-reflected waves from said terminal teeth which are 180° out of phase due to the fact that said active terminal tooth is electrically connected to the associated comb bus bar while said inactive terminal tooth is not, and wherein said transducer is further characterized by having the axial positions of said terminal teeth along the transducer axis correlated such that spurious waves boundary-reflected from one terminal tooth are in canceling phase relationship with waves reflected from the other terminal tooth.

9. In a surface wave transmitting device having a piezoelectric surface wave propagative medium and an apodized interdigitated comb-type transducer on a surface of said medium responsive to input signals for launching on said surface of said medium surface waves of predetermined center wavelength, said transducer comprising interdigitated interactive combs of conductive teeth, each of said teeth being divided into two one-eighth center wavelength tooth elements separated by one-eighth center wavelength, the leading edges of each element being spaced by one-fourth center wavelength, the combs of said transducer having a predetermined gradation in the length of overlap between the active comb teeth, that is, the adjacent overlapped teeth connected to the bus bar of opposed combs, said combs each having an inactive tooth collinear with an active tooth on the opposed comb, said transducer being terminated, on at least one end, by tooth elements on opposed first and second combs of generally the same length, one active and one inactive, respectively, the improvement characterized by:

said input transducer having an inactive terminal tooth element on said second comb electrically disconnected from the bus bar of said second comb and having an opposed active terminal tooth element on said first comb electrically connected to the bus bar of said first comb, said transducer being further characterized by having said terminal tooth elements collinear and of equal width such that surface waves entering or exiting said transducer at said one end produce boundary-reflected waves from said terminal tooth elements which are 180° out of phase due to the fact that said active terminal tooth element is electrically connected to said first comb bus while said inactive tooth element is disconnected from said second comb bus bar and such that spurious waves boundary-reflected from said active terminal tooth element are in canceling phase relationship with waves reflected from said inactive terminal tooth element in a wide band of wavelengths centered on said center wavelength.

10. In a surface wave transmitting device having a piezoelectric surface wave propagative medium, an interdigitated comb-type input transducer on a surface of said medium responsive to a source of input signals for launching on said surface of said medium surface waves of predetermined center wavelength, said input transducer being terminated, at at least one end, by a terminal tooth on each of opposed first and second combs, said surface wave transmitting device also including a surface wave receiving element disposed on said surface for receiving said surface waves from said input transducer, the improvement characterized by:

said input transducer having the terminal tooth on said first comb electrically disconnected from the bus bar of said first comb and having the opposed terminal tooth on said second comb electrically connected to the bus bar of said second comb, whereby surface waves entering or exiting said transducer at said end produce boundary reflected waves from said terminal teeth which are 180° out of phase due to the fact that said one terminal tooth is electrically connected to the associated comb bus bar while the other tooth is not, and wherein said input transducer is further characterized by having the positions of said terminal teeth along the transducer axis correlated such that spurious waves boundary-reflected from one terminal tooth are in canceling phase relationship with waves reflected from the other terminal tooth;

said surface wave device being further characterized by said receiving element being of sufficient width on said surface of said medium to intercept and electrically destructively combine said out-of-phase spurious waves reflected from said terminal teeth, said receiving element effecting suppression of spurious signal component due to mechanical boundary-reflected waves in inverse relation to the magnitude of the difference in the lengths of said terminal teeth.

11. In a surface wave transmitting device having a piezoelectric surface wave propagative medium, an interdigitated comb-type input transducer on a surface of said medium responsive to a source of input signals for launching on said surface of said medium surface waves of predetermined center wavelength, said input transducer being terminated on at least one end by a terminal tooth on each of opposed first and second combs whose lengths differ by much less than an order of magnitude, said surface wave transmitting device also including a surface wave receiving element disposed on said surface for receiving said surface waves from said input transducer, the improvement characterized by:

said input transducer having the terminal tooth on said first comb inactive and electrically disconnected from the bus bar of said first comb and having the opposed terminal tooth on said second comb active and electrically connected to the bus bar of said second comb, whereby surface waves entering or exiting said transducer at said one end produce boundary-reflected waves from said terminal teeth which are 180° out of phase due to the fact that said active terminal tooth is electrically connected to the associated comb bus bar while the inactive tooth is not, and wherein said transducer is further characterized by having said terminal teeth collinear and of equal width such that spurious waves boundary-reflected from one terminal tooth are in canceling phase relationship with waves reflected from the other terminal tooth in a wide band of wavelengths centered on said center wavelength;

said surface wave device being still further characterized by said receiving element being of sufficient width on said surface of said medium to intercept and electrically destructively combine said out-of-phase spurious waves reflected from said terminal teeth, said receiving element effecting suppression of spurious signal components due to mechanical boundary-reflected waves in inverse relation to the magnitude of the difference in the lengths of said terminal teeth.

12. In a surface wave transmitting device having a piezoelectric surface wave propagative medium and an apodized interdigitated comb-type input transducer on a surface of said medium responsive to input signals for launching on said surface of said medium surface waves of predetermined center wavelength, said input transducer comprising interdigitated interactive combs of conductive teeth, the combs of said input transducer having a predetermined gradation in the length of overlap between the active comb teeth, that is, the adjacent overlapped teeth conncted to the bus bars of opposed combs, said combs each having an inactive tooth collinear with each active tooth on the opposed comb, said input transducer being terminated, on at least one end, by a terminal tooth on each of opposed first and second combs, said surface wave transmitting device also including an output surface wave transducer disposed on said surface for receiving said surface waves from said input transducer and for developing an output signal therefrom, the improvement characterized by:

said input transducer having the terminal tooth on said first comb inactive and electrically disconnected from the bus bar of said first comb and having the opposed terminal tooth on said second comb active and electrically connected to the bus bar on said second comb, whereby surface waves entering or exiting said transducer at said one end produce boundary-reflected waves from said terminal teeth which are 180° out of phase due to the fact that said active terminal tooth is electrically connected to the associated comb bus bar while said inactive tooth is not, and wherein said transducer is further characterized by having the axial positions of said terminal teeth along the transducer axis correlated such that spurious waves boundary-reflected from one terminal tooth are in canceling phase relationship with waves reflected from the other terminal tooth, said surface wave device being further characterized by said output transducer being of sufficient width on said surface of said medium to intercept and electrically destructively combine said out-of-phase spurious waves reflected from said terminal teeth, said output transducer thereby developing output signals in which spurious signal components due to mechanical boundary-reflected waves are suppressed in inverse relation to the magnitude of the difference in the length of said terminal teeth.

13. In a surface wave transmitting device having a piezoelectric surface wave propagative medium and an apodized interdigitated comb-type input transducer on a surface of said medium responsive to input signals for launching on said surface of said medium waves of predetermined center wavelength, said input transducer comprising interdigitated interactive combs of conductive teeth, each of said teeth being divided into two one-eighth center wavelength tooth elements separated by one-eighth center wavelength, the leading edges of each element being spaced by one-fourth center wavelength, the combs of said launch transducer having a predetermined gradation in the length of overlap between the active comb teeth, that is, the adjacent overlapped teeth connected to the bus bars of opposed combs, said combs each having an inactive tooth collinear with each active tooth on the opposed comb, said input transducer being terminated, on at least one end, by tooth elments on opposed first and second combs of approximately the same length, one active and one inactive, respectively, said device also including an output surface wave transducer disposed on said surface for receiving said surface waves from said input transducer and for developing an output signal therefrom, the improvement characterized by:

said input transducer having an inactive terminal tooth element on said second comb electrically disconnected from the bus bar of said second comb and having an opposed active terminal tooth element on said first comb electrically connected to the bus bar of said first comb, said transducer being further characterized by having said terminal tooth elements collinear and of equal width such that surface waves entering or exiting said transducer at said one end produce boundary-reflected waves from said terminal tooth elements which are 180° out of phase due to the fact that said active terminal tooth element is electrically connected to said first comb bus bar while said inactive tooth element is electrically disconnected from said second comb bus bar and such that spurious waves boundary-reflected from said active terminal tooth are in canceling phase relationship with waves reflected from said inactive terminal tooth in a wide band of wavelengths centered on said center wavelength;

said surface wave device being further characterized by said output transducer being of sufficient width on said surface of said medium to intercept and electrically destructively combine said out-of-phase spurious waves reflected from said terminal tooth elements, said output transducer thereby developing output signals in which spurious signal components due to mechanical boundary-reflected waves are suppressed.

* * * * *